United States Patent
Nakamiya et al.

(10) Patent No.: US 6,593,823 B2
(45) Date of Patent: Jul. 15, 2003

(54) OSCILLATION CIRCUIT AND ELECTRONIC CIRCUIT, AND SEMICONDUCTOR DEVICE, TIMEPIECE AND ELECTRONIC EQUIPMENT PROVIDED WITH THE SAME

(75) Inventors: Shinji Nakamiya, Matsumoto (JP); Hiroshi Yabe, Shiojiri (JP); Tadao Kadowaki, Chino (JP); Yoshiki Makiuchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 4 days.

(21) Appl. No.: 09/962,207

(22) Filed: Sep. 26, 2001

(65) Prior Publication Data

US 2002/0070817 A1 Jun. 13, 2002

(30) Foreign Application Priority Data

Sep. 26, 2000 (JP) ........................................ 2000-292028

(51) Int. Cl.$^7$ ................................................. H03B 1/00
(52) U.S. Cl. ........................... 331/74; 331/62; 331/158; 331/185; 331/186
(58) Field of Search ........................... 331/62, 74, 158, 331/186, 185

(56) References Cited

U.S. PATENT DOCUMENTS

| | | | |
|---|---|---|---|
| 4,048,584 A | * | 9/1977 | Ulmer .......................... 331/62 |
| 5,532,621 A | | 7/1996 | Kobayashi et al. |
| 5,617,283 A | * | 4/1997 | Krakauer et al. .............. 361/56 |
| 5,903,184 A | * | 5/1999 | Hiraga ......................... 327/546 |
| 5,929,715 A | * | 7/1999 | Nakamiya et al. ............. 331/62 |
| 6,147,564 A | * | 11/2000 | Nakamiya et al. ............. 331/62 |
| 6,166,609 A | * | 12/2000 | Nakamiya et al. ........... 331/109 |

FOREIGN PATENT DOCUMENTS

| | | |
|---|---|---|
| EP | 0 915 409 A1 | 5/1999 |
| JP | 50-98263 | 8/1975 |
| JP | A 7-183774 | 7/1995 |
| JP | A 8-8651 | 1/1996 |
| JP | A 9-205325 | 8/1997 |
| JP | A 10-160867 | 6/1998 |
| JP | A 11-289222 | 10/1999 |
| WO | WO 98/39693 | 9/1998 |

* cited by examiner

*Primary Examiner*—Michael Tokar
*Assistant Examiner*—Khai Nguyen
(74) *Attorney, Agent, or Firm*—Oliff & Berridge, PLC.

(57) ABSTRACT

An oscillation circuit including a first electrostatic protection circuit connected between a signal path of the oscillation circuit and a constant-voltage side, and bypassing an electrostatic voltage of a first polarity that intrudes into the signal path to a side of a constant bypass voltage through a first semiconductor rectifier element. A second electrostatic protection circuit is connected between the signal path and a reference potential side, and bypassing an electrostatic voltage of a second polarity that intrudes into the signal path to the reference potential side through a second semiconductor rectifier element. The constant bypass voltage is set to a value such that the first and second semiconductor rectifier elements are not turned on by voltage change in the signal path caused by a leakage current, even when a leakage current is generated between the signal path and a power-supply voltage line.

11 Claims, 12 Drawing Sheets

$C_G'$ ; $C_{GO}$, $C_O$, $C_P$, $C_{VDD}$
$C_D'$ ; $C_{DO}$, $C_O$, $C_P$, $C_{VSS}$

C_GP, C_DP: WIRING CAPACITANCES

GUARANTEED OPERATING TEMPERATURE
OF OSCILLATION CIRCUIT

OSCILLATION CIRCUIT AND ELECTRONIC CIRCUIT, AND SEMICONDUCTOR DEVICE, TIMEPIECE AND ELECTRONIC EQUIPMENT PROVIDED WITH THE SAME

Japanese patent application no. 2000-292028, filed Sep. 26, 2000, is hereby incorporated by reference in its entirety.

TECHNICAL FIELD

The present invention relates to an oscillation circuit and an electronic circuit, and a semiconductor device, a timepiece and electronic equipment provided with the same.

BACKGROUND

The oscillation circuit used in a portable wristwatch or electronic equipment often has a configuration such that a principal circuit portion thereof that is formed on a semiconductor substrate is connected by input-output terminals to a crystal oscillator provided at a separate location on that semiconductor substrate. For that reason, an electrostatic protection circuit is provided on the input-output terminal side of that principal circuit portion, to protect that principal circuit portion from any surge voltage intruding from the exterior through those input-output terminals.

However, in such a conventional circuit, the power source of the oscillation circuit drive is utilized for bypassing surge voltages of the electrostatic protection circuit, so that if there should be a change in the power-supply voltage of the oscillation circuit for some reason, that would cause a change in the parasitic capacitance of that electrostatic protection circuit and, as a result, that would raise a problem in that the oscillation frequency of the oscillation circuit will change.

SUMMARY

An objective of the present invention is to provide an oscillation circuit and an electronic circuit which enable protection of the principal circuit portions thereof from any surge voltage that intrudes from the exterior through input-output terminals, and which can oscillate at a stable frequency without being affected by changes in the power-supply voltage of the oscillation circuit, together with a semiconductor device, a timepiece and electronic equipment that are provided with the oscillation circuit and the electronic circuit.

(1) To achieve this objective, an oscillation circuit in accordance with the present invention comprises:

a first electrostatic protection circuit connected between a signal path of the oscillation circuit and a constant-voltage side, and bypassing an electrostatic voltage of a first polarity that intrudes into the signal path to a side of a constant bypass voltage through a first semiconductor rectifier element; and a second electrostatic protection circuit connected between the signal path and a reference potential side, and bypassing an electrostatic voltage of a second polarity that intrudes into the signal path to the reference potential side through a second semiconductor rectifier element, wherein the constant bypass voltage is set to a value such that the first and second semiconductor rectifier elements are not turned on by voltage change in the signal path caused by a leakage current, even when a leakage current is generated between the signal path and a power-supply voltage line.

In this case, when it is assumed that the power-supply voltage is $V_{SS}$, the forward-direction on-voltage of the semiconductor rectifier element is $V_{Fon}$, and the potential difference between the signal path and the power-supply voltage line when a leakage current is generated is $V_R$; the constant bypass voltage $V_{reg}$ may be set in such a manner that the following inequality is satisfied, within a range of expected operating voltages of the power-supply voltage $|V_{SS}|$:

$$|V_{reg}| > |V_{SS}| - V_R - V_{Fon}$$

The constant bypass voltage may be a constant voltage $V_{reg1}$ that is supplied separately from a constant voltage $V_{reg2}$ supplied as a power-supply voltage for the oscillation circuit.

The constant bypass voltage $V_{reg1}$ the constant voltage $V_{reg2}$ supplied as the power-supply voltage of the oscillation circuit maybe set in such a manner that the following inequality is satisfied:

$$|V_{reg1}| > |V_{reg2}|$$

One voltage $V_{reg2}$, which is one of a supplied constant voltage from a constant voltage supply circuit and a constant voltage obtained by dividing or stepping up the supplied constant voltage, may be used as a power-supply voltage for the oscillation circuit, and the other voltage $V_{reg1}$ may be used as the constant bypass voltage.

A constant voltage having a temperature characteristic that ensures a small voltage variation with respect to a temperature change may be used as the constant bypass voltage. For example, a constant voltage for driving a temperature sensor can be used as this constant bypass voltage, since it has a temperature characteristic with a shallow slope.

A discharging semiconductor rectifier element for discharging an electrostatic voltage of a first polarity that intrudes into the signal path to a side of a constant bypass voltage through the first semiconductor rectifier element, may be provided between an output of the constant voltage supply circuit which supplies the constant bypass voltage and the reference potential.

(2) An electronic circuit may be formed by using an oscillation circuit in accordance with the present invention.

This electronic circuit may comprise the oscillation circuit and a drive circuit which drives a driven section, based on an output of the oscillation circuit.

This makes it possible to obtain an electronic circuit that enables satisfactory operation using a stable frequency output supplied from the oscillation circuit.

A semiconductor device may be formed by using an oscillation circuit or electronic circuit in accordance with the present invention.

In other words, if an oscillation circuit that uses a crystal oscillator or an electronic circuit using such an oscillation circuit is formed on a semiconductor device, the principle circuit portions of the oscillation circuit formed on the circuit board are often connected by wiring to a crystal oscillator provided in a different area of that circuit board. In such a case, there is a danger that electrostatic voltages such as surge voltages will intrude as noise from the connections between the crystal oscillator and the principal circuit portions, damaging the interior of the circuitry.

In that case, too, the present invention makes it possible to use an electrostatic protection circuit to remove an electrostatic voltage such as a surge voltage that may intrude into the circuitry, and thus implement a semiconductor device that can drive the various parts of the circuit in a favorable manner using a stabilized oscillation output.

A timepiece may be formed by using an oscillation circuit or electronic circuit in accordance with the present invention. This timepiece may comprise an oscillation circuit and a time display section which displays a time based on the oscillation circuit.

The present invention makes it possible to provide a timepiece that can keep accurate time without being affected by variations in the power-supply voltage of the main power source thereof.

Electronic equipment may be formed by using an oscillation circuit or electronic circuit in accordance with the present invention.

Electronic equipment may be configured to comprise an oscillation circuit, a drive circuit which drives a driven section, based on an output of the oscillation circuit, and the driven section.

This makes it possible to implement electronic equipment that can generate an accurate oscillation output that is not affected by any changes in the power-supply voltage of the oscillation circuit, to cause the operation of the parts of the circuitry.

In particular, a timepiece or electronic equipment that uses an oscillation circuit or electronic circuit in accordance with the present invention is extremely suitable as a portable timepiece or other item of electronic equipment that uses an exchangeable battery or a rechargeable battery as a main power source.

DETAILED DESCRIPTION

Preferred embodiments of the present invention are described below with reference to examples in which the present invention is applied to a wristwatch having an analog display.

(1) Overall Configuration

Figure 1:
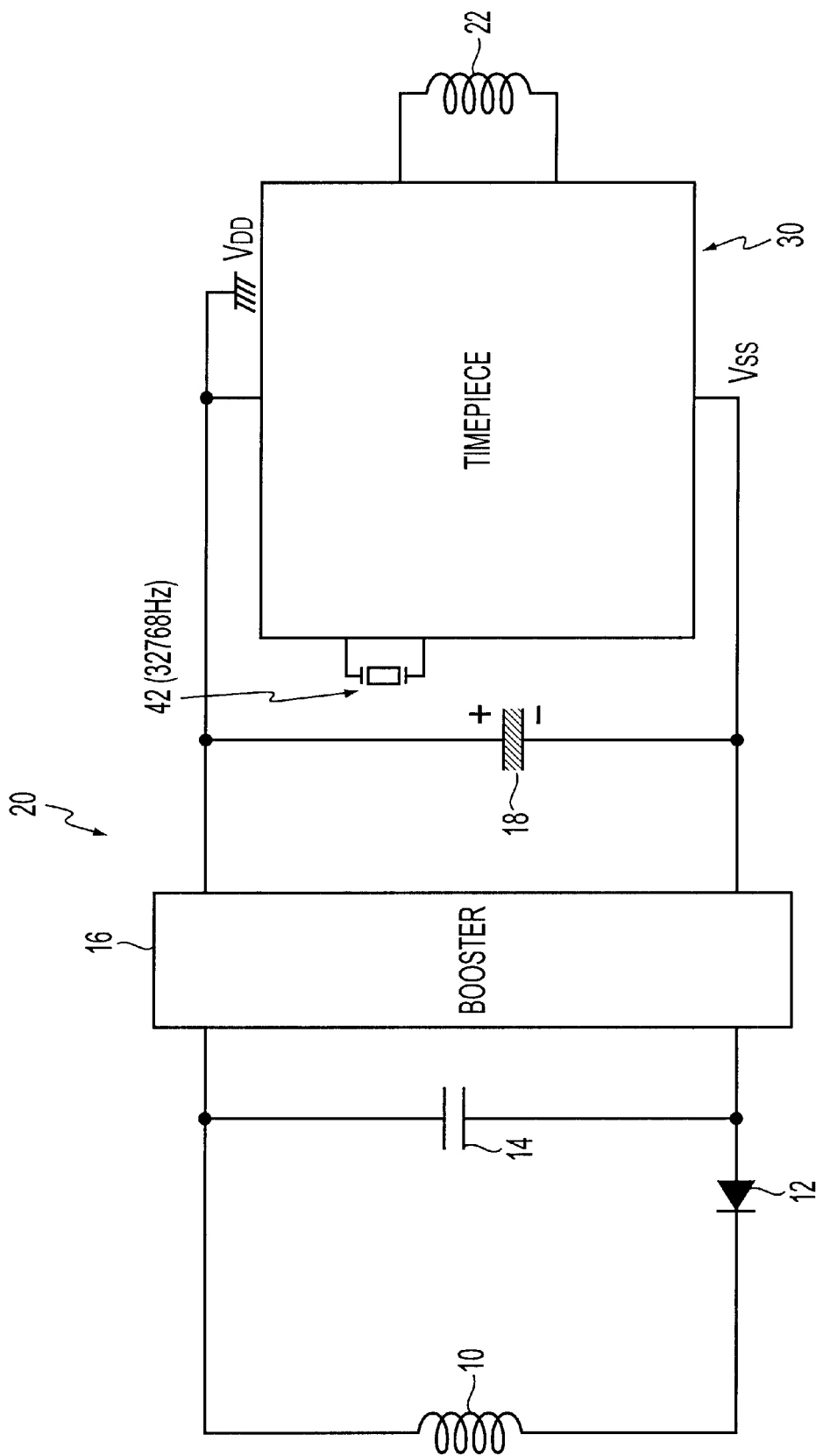
FIG. 1 is a block diagram of an example of an electric circuit for a wristwatch, to which the present invention is applied.

An example of an electronic circuit used in this wristwatch is shown in FIG. 1.

This wristwatch has an internal power generation mechanism that is not shown in this figure. When the user moves the arm on which the wristwatch is placed, a rotating weight of a power generation mechanism rotates, a power-generating rotor is made to rotate at high speed by the movement energy generated thereby, and an AC voltage is output from a power-generating coil 10 provided on a power-generating stage side.

This AC voltage is rectified by a diode 12 and charges a secondary battery 14. This secondary battery 14 configures a main power source 20, together with a booster circuit 16 and an auxiliary capacitor 18.

With this embodiment of the invention, when the voltage of the secondary battery 14 drops so that is it not sufficient as the drive voltage of the timepiece, the voltage of the secondary battery 14 is converted by the booster circuit 16 to a higher voltage that makes it possible to drive the timepiece, and accumulates in the auxiliary capacitor 18. This voltage of the auxiliary capacitor 18 operates a timepiece circuit 30 as a power-supply voltage $V_{SS}$.

This timepiece circuit 30 is formed as a semiconductor device, with the configuration being such that an oscillation frequency which is preset by using a crystal oscillator 42 connected by terminals to this semiconductor device is generated, as an oscillation frequency of 32,768 Hz in this case, then drive pulses having different polarities each second are output by dividing this oscillation output. These drive pulses are input to a drive coil 22 of a step motor that is connected to the timepiece circuit 30. This ensures that the rotor of a step motor (not shown in the figure) is driven in rotation every time a drive pulse passes therethrough, which drives the second, minute, and hour hands of the timepiece to give an analog display of time.

(2) Crystal Oscillation Circuit

Figure 2:
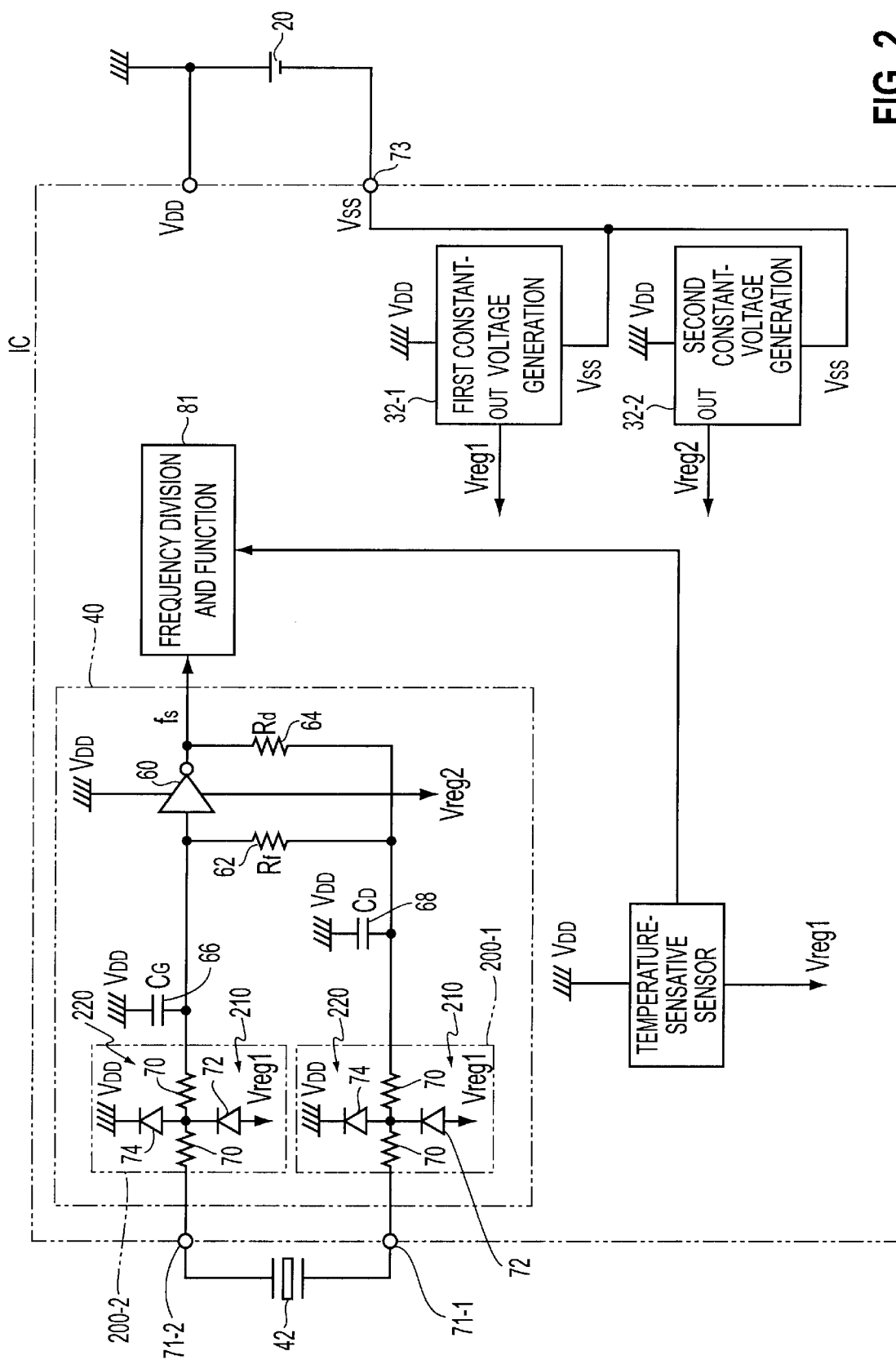
FIG. 2 is a block diagram of the timepiece circuit portion of the electronic circuit of FIG. 1.

A specific circuit configuration of a crystal oscillation circuit 40 that is a feature of this embodiment of the present invention is shown in FIG. 2.

This crystal oscillation circuit 40 comprises basically an inverter 60, a feed-back resistor 62, a drain resistor 64, and phase-compensation capacitors 66 and 68, and an oscillation output thereof with an oscillation frequency $f_s$ is output to a frequency division circuit and function circuit 81.

First and second constant voltage generation circuits 32-1 and 32-2 generate first and second constant voltages $V_{reg1}$ and $V_{reg2}$ from a voltage $V_{SS}$ that is supplied from the main power source 20. These first and second constant voltages $V_{reg1}$ and $V_{reg2}$ could be either the same voltage or different voltages. The second voltage $V_{reg2}$ is used as a power-supply voltage for the oscillation circuit drive and is applied to the inverter 60.

Figure 11:
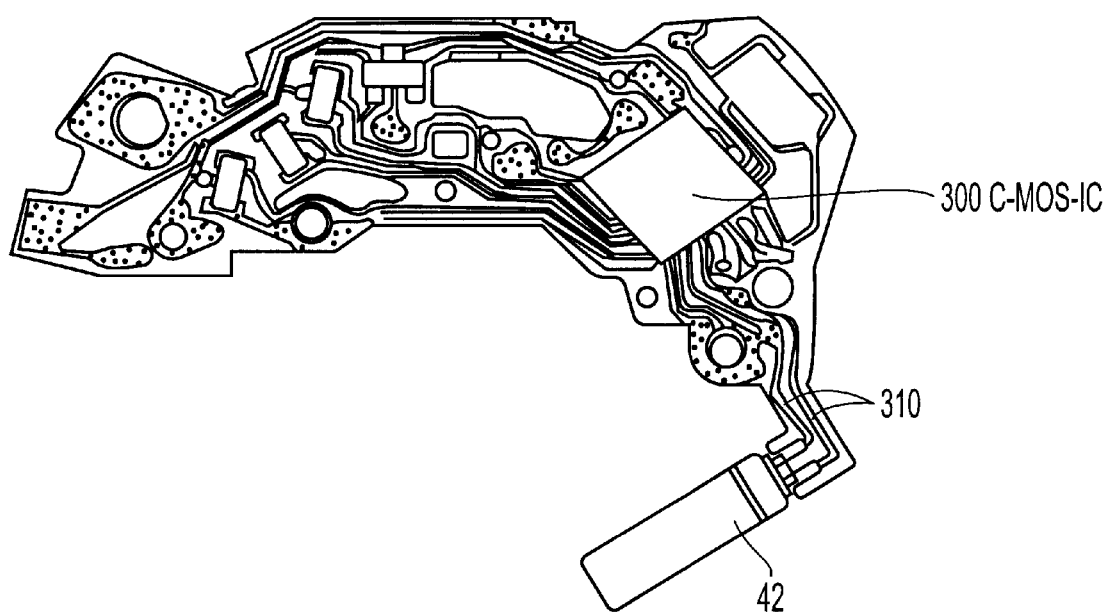
FIG. 11 is illustrative of the layout of a CMOS-IC that forms essential components of a crystal oscillator and an oscillation circuit on a substrate.

It should be noted that the timepiece circuit 30 of FIG. 1 is formed by a CMOS-IC 300, which is basically a semiconductor circuit, except for the crystal oscillator 42 which is shown in FIG. 11, and the CMOS-IC 300 and crystal oscillator 42 that configure the essential components of this oscillation circuit are connected by wiring 310.

In other words, the crystal oscillator 42 is connected by input-output terminals to the main circuitry portions of the oscillation circuit 40 that is formed within the CMOS-IC 300. There is therefore a danger that a surge voltage that is input through these input-output terminals could damage the internal circuitry.

This surge voltage could be one imposed from the jig used during assembly or one imposed from a human operator.

For that reason, electrostatic protection circuits 200-1 and 200-2 are provided within the crystal oscillation circuit 40.

These electrostatic protection circuits 200-1 and 200-2 are provided for each signal path connected to the input terminals. Since these electrostatic protection circuits 200-1 and 200-2 have the same configuration, the description herein takes just the electrostatic protection circuit 200-1 as an example.

This electrostatic protection circuit 200-1 comprises a resistor 70, a first electrostatic protection circuit section 210 that provides a bypass on the constant-voltage side for selectively bypassing through a first semiconductor rectifier element 72 any electrostatic voltages of a negative polarity that are introduced into the signal path of the oscillation circuit, and a second electrostatic protection circuit section 220 that provides a bypass on the ground side for selectively bypassing through a second semiconductor rectifier element 74 any electrostatic voltages of a positive polarity that are introduced into the signal path of the oscillation circuit.

This resistor 70 is connected in series with the signal path and is designed to protect the rectifier elements 72 and 74 from surge voltages.

The first and second semiconductor rectifier elements 72 and 74 are configured of diodes of a PN junction type. The diode that forms the first semiconductor rectifier element 72 is connected in the reverse direction to the output terminal side of the constant voltage ($V_{reg1}$) of the constant voltage generation circuit 32-1, and the diode that forms the second semiconductor rectifier element 74 is connected in the forward direction to the ground ($V_{DD}$) side.

This ensures that any surge voltage of a negative polarity that is introduced from the exterior is bypassed to the constant voltage terminal $V_{reg1}$ side and any surge voltage of a positive polarity is bypassed to the ground side, thus preventing the introduction thereof into the semiconductor circuitry.

This embodiment of the present invention is characterized in that a constant voltage $V_{reg1}$, which does not vary even if the power-supply voltage $V_{reg2}$ if the drive power source of the oscillation circuit does vary, is used as the constant bypass voltage of the first semiconductor rectifier element 72.

Figure 3:
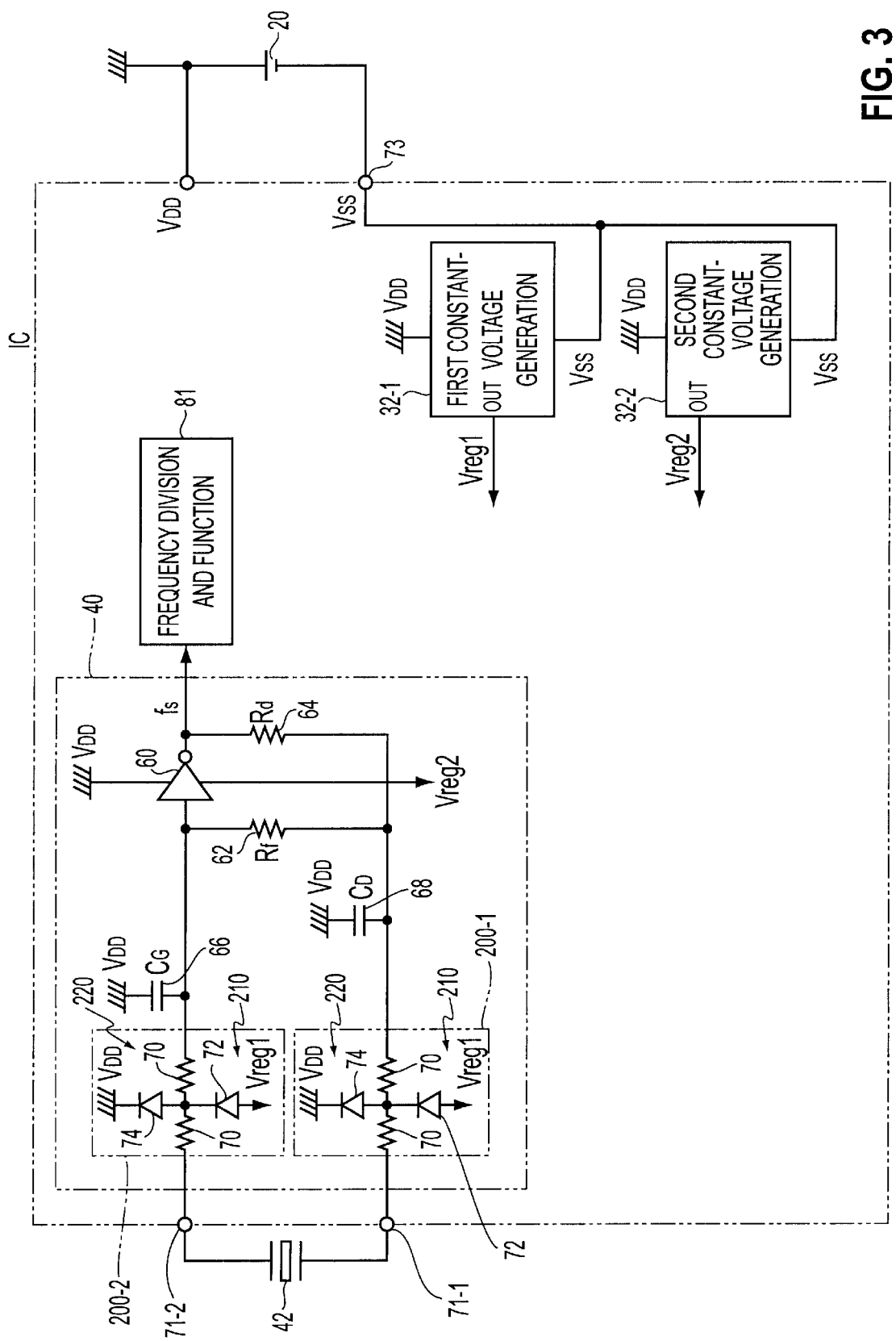
FIG. 3 is a block diagram of another embodiment of the timepiece circuit portion.
Figure 4:
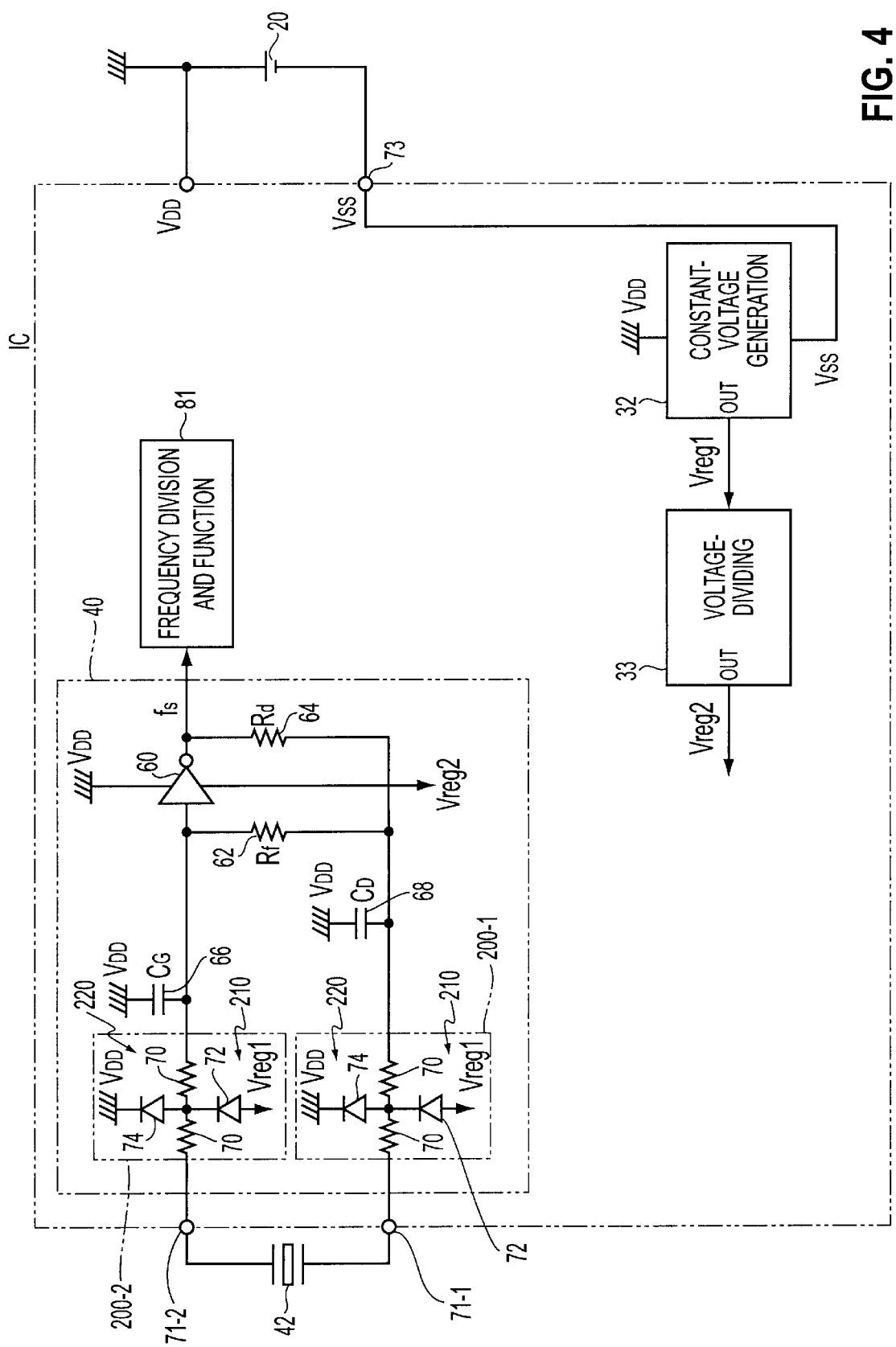
FIG. 4 is a block diagram of a further embodiment of the timepiece circuit portion.

Various embodiments of this constant voltage $V_{reg1}$ supply are illustrated in FIGS. 2 to 4.

The description first concerns the electronic circuit of FIG. 2.

The electronic circuit of this embodiment comprises the plurality of constant voltage generation circuits 32-1 and 32-2 that generate different constant voltages $V_{reg1}$ and $V_{reg2}$, where one constant voltage $V_{reg1}$ drives a temperature sensor 400 and the other constant voltage $V_{reg2}$ drives the crystal oscillation circuit 40.

This temperature sensor 400 detects the environment in which the electronic circuit is being used, and supplies a detection signal to the frequency division circuit and function circuit 81.

In this case, the frequency division circuit and function circuit 81 functions both as a frequency division circuit that divides the output of the oscillation circuit 40 and also as various functional circuits.

The crystal oscillation circuit 40 of this embodiment of the invention is characterized in that it uses a constant voltage that differs from the constant voltage used for driving the oscillation circuit, more specifically, the constant voltage $V_{reg1}$ for driving the temperature sensor 400, as the constant bypass voltage connected to the first electrostatic protection circuit section 210.

More specifically, a PN-junction diode 72 in each of the electrostatic protection circuits 200-1 and 200-2 has one end connected to the signal path side of the oscillation circuit and the other end connected to the constant voltage $V_{reg1}$ side.

The description now turns to the embodiment shown in FIG. 3.

This embodiment of the invention comprises the constant voltage generation circuit 32-2, which generates the constant voltage $V_{reg2}$ for driving the oscillation circuit 40, and the constant voltage generation circuit 32-1, which generates the constant bypass voltage $V_{reg1}$ used only by the electrostatic protection circuits 200-1 and 200-2.

The crystal oscillation circuit 40 is driven by the constant voltage $V_{reg2}$.

Each of the electrostatic protection circuits 200-1 and 200-2 has a diode 72 that functions as a first semiconductor rectifier element, which has one end connected to the constant voltage $V_{reg1}$ for the electrostatic protection circuits.

The description now turns to the embodiment shown in FIG. 4.

The electronic circuit of this embodiment of the invention comprises a the constant voltage generation circuit 32 that generates the given constant voltage $V_{reg}$ and a voltage-dividing circuit 33 that generates the given constant voltage $V_{reg2}$ by dividing this constant voltage $V_{reg1}$.

The oscillation circuit 40 uses this $V_{reg2}$ for driving.

In addition, each of the electrostatic protection circuits 200-1 and 200-2 has a diode 72 that functions as a first semiconductor rectifier element connected to the constant voltage $V_{reg1}$ side.

Note that the configuration could be such that the crystal oscillation circuit 40 is driven by using the constant voltage $V_{reg1}$ and the electrostatic protection circuits 200-1 and 200-2 are connected to the $V_{reg2}$ side, if necessary. Alternatively, if the voltage-dividing circuit 33 outputs a plurality of constant voltages as voltage-dividing outputs, the configuration could be such that one of this plurality of voltage-dividing outputs or the constant voltage $V_{reg1}$ is used for driving the crystal oscillation circuit 40 and the remaining voltages are connected to the electrostatic protection circuits 200-1 and 200-2. A booster circuit could also be used instead of a voltage-dividing circuit.

Use of any of the configurations shown in FIGS. 2 to 4 ensures that the oscillation frequency $f_s$ of the crystal oscillation circuit 40 is always at a constant value, without any variation in the parasitic capacitances of the semiconductor rectifier elements 72 and 74, if the power-supply voltage $V_{SS}$ of the main power source 20 or the power-supply voltage $V_{reg2}$ of the oscillation circuit should vary for any reason.

This is described in detail below.

Figure 5:
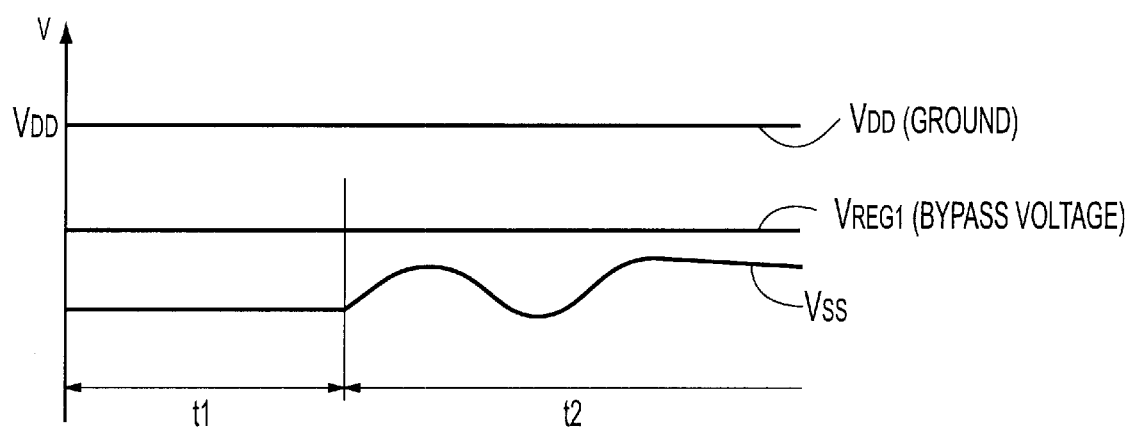
FIG. 5 is illustrative of the state of voltage variations in two different power sources used by the circuit of this embodiment of the present invention.

The relationship between the constant voltage $V_{reg1}$ for bypass and the power-supply voltage $V_{SS}$ is shown in FIG. 5. The power-supply voltage $V_{SS}$ (negative in this embodiment) supplied from the main power source has a value greater than the absolute value of the constant voltage $V_{reg1}$ (also negative in this embodiment) that is always output from each the constant voltage generation circuit 32. However, this power-supply voltage $V_{SS}$ often varies due to factors such as variations in load or the charging state of the main power source 20, as shown in FIG. 5.

In contrast thereto, the constant voltage $V_{reg1}$ that is output from the constant voltage generation circuit 32 is not affected much by this voltage $V_{SS}$ of the main power source, so it is always constant.

A known problem with the prior art, which occurs when the first semiconductor rectifier element 72 is connected to the voltage $V_{SS}$ side of the main power source 20 that has a large capacitance, is discussed below.

If the voltage $V_{SS}$ of the main power source 20 changes, the values of the parasitic capacitances of the first and second semiconductor rectifier elements 72 and 74 formed of semiconductor devices also change.

The parasitic electrostatic capacitance C of the semiconductor rectifier elements 72 and 74 formed of PN junctions within the IC, particularly of the PN junction portions thereof, is generally given by the following equation:

$$C = A\sqrt{\frac{N_D}{V_A + V_B}} \quad \text{(Equation 1)}$$

where A is a constant, $V_A$ is the applied voltage, $N_D$ is the impurity concentration, and $V_B$ is the potential difference across the PN junction.

From this equation, it is clear that this parasitic capacitance C varies as the power-supply voltage $V_A$ (=$V_{SS}$) varies.

If this parasitic capacitance C varies, the result is that the oscillation frequency $f_s$ of the crystal oscillation circuit 40 also changes. This is described in more detail below.

(2-1) Countermeasures Against Oscillation Frequency Variation

Figure 6A:
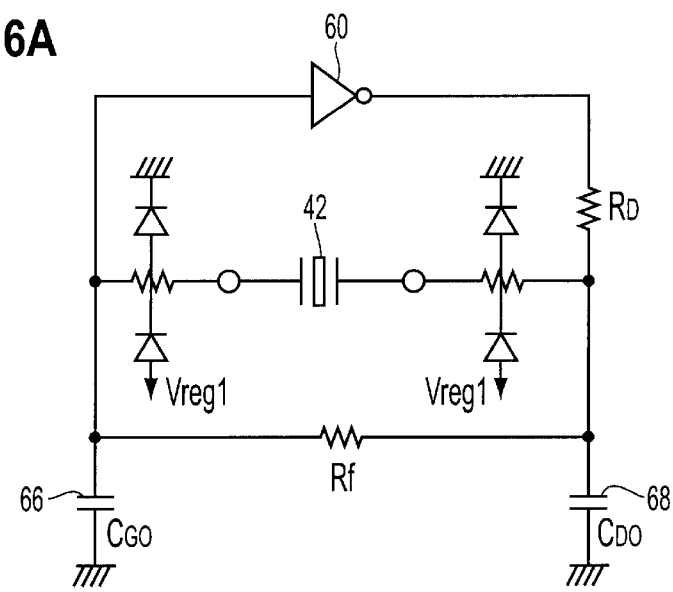
FIG. 6A is an equivalent circuit diagram of the crystal oscillation circuit of FIG. 2.

An equivalent circuit of the crystal oscillation circuit 40 is shown in FIG. 6A.

Figure 6B:
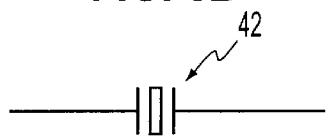
FIG. 6B is illustrative of the crystal oscillator.
Figure 6C:
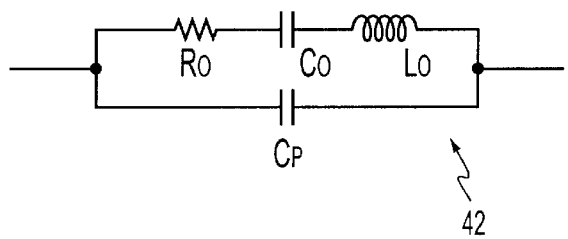
FIG. 6C is an equivalent circuit diagram of the crystal oscillator.

The crystal oscillator 42 is shown in FIG. 6B and an equivalent circuit thereof is shown in FIG. 6C.

Figure 6D:
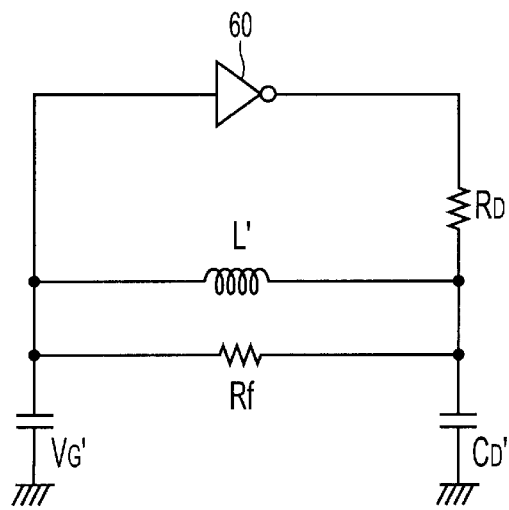
FIG. 6D is the equivalent circuit of FIG. 6A that has been formed from consideration of the equivalent circuit of the crystal oscillator.

If the equivalent circuit of FIG. 6C is used, the oscillation circuit 40 of FIG. 6A can be expressed as the circuit shown in FIG. 6D.

The oscillation frequency $f_s$ of the LC oscillation circuit (the oscillation circuit 40) expressed by the equivalent circuit of FIG. 6D is given by the following equation:

$$f_s \approx \frac{1}{2\pi\sqrt{L'C'_G}} \cdot f_i(C'_D) \quad \text{(Equation 2)}$$

It is clear from this equation that if the internal capacitance $C_G'$ of the oscillation circuit varies, the oscillation frequency $f_s$ also varies. In other words, since Equation 2 includes values of the parasitic capacitances $C_{VDD}$ and $C_{VSS}$ of the first and second semiconductor rectifier elements 72 and 74, any change in those values will make the oscillation frequency $f_s$ change.

In contrast thereto, the first semiconductor rectifier element 72 of this embodiment of the present invention is connected to the constant voltage $V_{reg1}$ that does not vary. For that reason, it is possible for the crystal oscillation circuit 40 to generate an oscillation output that is always at the constant frequency $f_s$ without being affected by the variation of the power supply voltage $V_{SS}$.

In addition, the above configurations ensure that the parasitic capacitances of the first and second semiconductor rectifier elements 72 and 74 are always constant. It is therefore possible to utilize the values of these parasitic capacitances actively as the phase-compensation capacitors 66 and 68. This makes it possible to ensure that the capacitances of the phase-compensation capacitors 66 and 68 of FIGS. 2 to 4 are small, which in turn makes it possible to omit those phase-compensation capacitors 66 and 68.

It therefore becomes possible to reduce the number of components of the crystal oscillation circuit 40 and increase the degree of integration thereof.

This embodiment of the invention also makes it possible to increase the parasitic capacitances of the semiconductor rectifier elements 72 and 74 themselves, by utilizing the parasitic capacitances of the first and second semiconductor rectifier elements 72 and 74 as either part or the entirety of the phase-compensation capacitors 66 and 68.

In other words, if the phase-compensation capacitors 66 and 68 and the diodes 72 and 74 are provided completely separately, it is necessary to use diodes 72 and 74 having small parasitic capacitances, from the viewpoint of reducing the overall capacitance of the crystal oscillation circuit 40 and reducing the power consumption thereof. In such a case, the electrostatic breakdown resistance also deteriorates in correspondence with this parasitic capacitance.

In contrast thereto, the parasitic capacitances of the semiconductor rectifier elements 72 and 74 of this embodiment of the present invention are used actively as the phase-compensation capacitors, making it possible to use components with large parasitic capacitances as semiconductor elements. As a result, the electrostatic breakdown resistances of the elements 72 and 74 themselves are increases, making it possible to increase the electrostatic protection capabilities of the entire circuit.

(3) Another Embodiment

Figure 7:
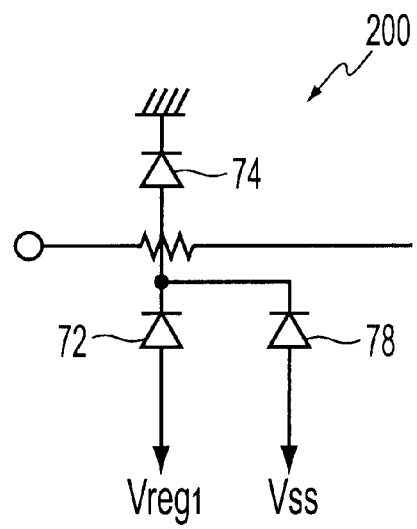
FIG. 7 is illustrative of another electrostatic protection circuit.

Another example of the application of the present invention is shown in FIG. 7. The electrostatic protection circuit of this embodiment is characterized in the use of a third semiconductor rectifier element 78 that is connected in the reverse direction to the main power source $V_{SS}$. Since this makes it possible to configure a surge voltage bypass circuit on the large-capacitance main power source 20 side, it enables an increase in the electrostatic breakdown resistance of the electrostatic protection circuit 200.

Note that variations in the power-supply voltage $V_{SS}$ will have an effect in that they will cause the parasitic capacitance of the third semiconductor rectifier element 78 to vary. For that reason, amount of variation of the parasitic capacitance of the third semiconductor rectifier element 78 is preferably set so that it has only a few percentage points of effect with respect to the amount of variation of the total parasitic capacitance of the first semiconductor rectifier element 72 and the third semiconductor rectifier element 78, by setting the value of the parasitic capacitance of the first semiconductor rectifier element 72 one-digit to two-digit larger than that of the parasitic capacitance of the third semiconductor rectifier element 78. This ensures that the value of the electrostatic capacitance of the entire circuit is always stable, making it possible to obtain a more stable oscillation output.

(4) Comparison with Conventional Art

Figure 8:
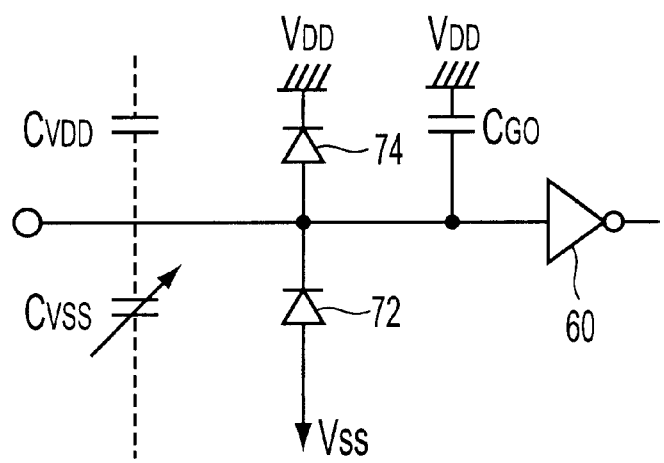
FIG. 8 is illustrative of an electrostatic protection circuit used in the prior art.

An example of a conventional electrostatic protection circuit in which the semiconductor rectifier element 72 is connected to the main power source $V_{SS}$ side is shown in FIG. 8. In the conventional example of FIG. 8, the first semiconductor rectifier element 72, which is connected to the main power source that varies with the power-supply voltage $V_{SS}$, is represented in circuit terms as an element with variable parasitic capacitance $C_{VSS}$.

Studies on the frequency deviation in an example of a crystal oscillation circuit that uses this conventional electrostatic protection circuit are described below.

In the conventional circuit of FIG. 8, actual measured values of $C_G$ and $C_D$, which are the total capacitances of the internal circuitry of the IC (semiconductor device) comprising the electrostatic protection circuit 200, as seen from the gate terminal and drain terminal of a transistor that configures a gate 60 of the crystal oscillation circuit 40, are given by the equations below. In this case, since the resistance $R_f$ of a resistor 62 is extremely high, the value of $C_{DO}$ can be omitted from the value of $C_G$ in the following equations, as can the value of $C_{GO}$ from the value of $C_D$.

$$C_G = C_{GO} + C_{VDD} + C_{VSS} + C_{GP} = 10.8(PF)$$

$$C_D = C_{DO} + C_{VDD} + C_{VSS} + C_{DP} = 6.1.(PF) \quad \text{(Equation 3)}$$

When the power-supply voltage $V_{SS}$ varies from 1.1 volts to 2.4 volts in this conventional circuit, the amount of variation of the parasitic capacitance $C_{VSS}$ of the first semiconductor rectifier element 72 is $\Delta C_{VSS} = 0.07$ (PF).

Studies were then performed on how much the amount of variation of this parasitic capacitance affects the overall electrostatic capacitance of the crystal oscillation circuit 40.

First of all, if the ratio of the amount of variation of the parasitic capacitance of the electrostatic protection circuit 200-2 with respect to $C_G$ of FIG. 3 is obtained, it can be expressed as follows:

$$\frac{\Delta C_{VSS}}{C_{GO} + C_{VDD} + C_{VSS} + C_{GP}} \left( = \frac{7}{1080} \right) \quad \text{(Equation 4)}$$

Similarly, the ratio of the amount of variation of the parasitic capacitance of the electrostatic protection circuit 200-1 with respect to $C_D$ of FIG. 3 is given by:

$$\frac{\Delta C_{VSS}}{C_{DO} + C_{VDD} + C_{VSS} + C_{DP}} \left( = \frac{7}{610} \right) \quad \text{(Equation 5)}$$

In this case, $C_{GP}$ and $C_{DP}$ denote the corresponding wiring capacitances of the crystal oscillation circuit 40.

If the value of the frequency deviation of the oscillation circuit is obtained from this amount of variation of parasitic capacitance, it is (df/dv)=3 (PPM). This is approximately 8 seconds if calculated over a month. If the permissible monthly variation of a timepiece is on the order of 15 seconds, 8 seconds of that 15 seconds could be taken up by variations in the parasitic capacitance, which cannot possibly be permitted.

In contrast thereto, the first semiconductor rectifier element 72 is connected to the power source $V_{reg1}$ that does not vary, as shown in FIGS. 2 to 4, so that the variation in the parasitic capacitance thereof can be substantially ignored and thus the frequency deviation of the oscillation frequency of the crystal oscillation circuit 40 itself is improved to a degree such that it can be ignored, in comparison with the conventional circuit.

Figure 9:
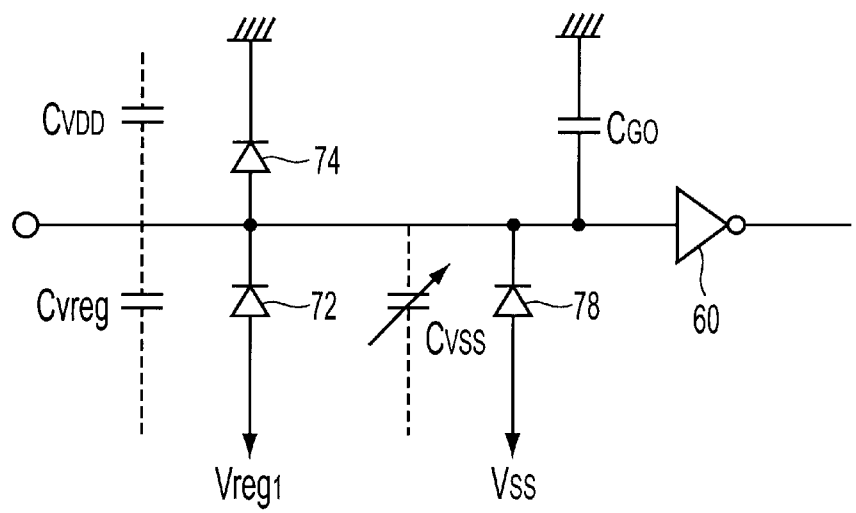
FIG. 9 is an equivalent circuit of the electrostatic protection circuit of FIG. 7.

Similar studies have been performed on the crystal oscillation circuit 40 that uses the electrostatic protection circuit of the other embodiment shown in FIG. 7. An equivalent circuit of this electrostatic protection circuit is shown in FIG. 9. In this case, the third semiconductor rectifier element 78 forms an element in which the parasitic capacitance $C_{VSS}$ varies.

In the circuit shown in FIG. 9 too, the parasitic capacitance of the third semiconductor rectifier element 78 is formed to be sufficiently smaller than the parasitic capacitance of the first semiconductor rectifier element 72, so that the frequency deviation of the overall circuit can be made much smaller than that in which the electrostatic protection circuit of FIG. 8 is used, even if this parasitic capacitance $C_{VSS}$ varies.

Figure 12:
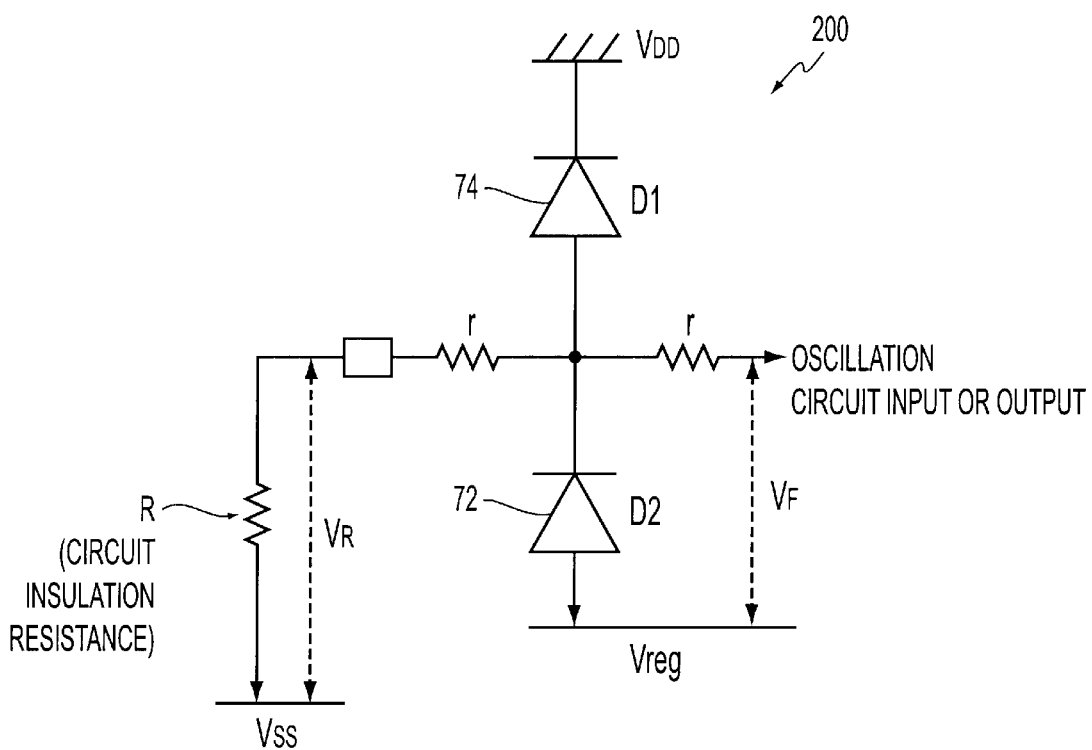
FIG. 12 is an equivalent circuit of a case in which a leakage current is generated between the signal path of the oscillation circuit and the power-supply voltage line.

(5) Embodiments with Constant Bypass Voltage $V_{reg1}$ Connected to Electrostatic Protection Circuit 5-1 First Embodiment The constant bypass voltage $V_{reg1}$ that is connected to the electrostatic protection circuit 200-1 is set to a value such that the first and second semiconductor rectifier elements 72 and 74 do not turn on because of a change in voltage in the signal path generated by that leakage current, even if a leakage current is generated between the signal path of the crystal $V_{SS}$ oscillation circuit 40 and the line for the power-supply voltage If this power-supply voltage is assumed to be $V_{SS}$, the forward-direction on-voltage of each of the semiconductor rectifier elements 72 and 74 is $V_{Fon}$, and the potential difference between the signal line and the power-supply voltage line when a leakage current is generated is $V_R$, as shown by way of example in FIG. 12, the constant bypass voltage $|V_{reg}|$ is set to a value such that the following inequality is satisfied, within a expected operating voltage for the power-supply voltage $|V_{SS}|$ (within the range of 1.2 to 2 V, by way of example):

$$|V_{reg}| > |V_{SS}| - V_R - V_{Fon}$$

This makes it possible to maintain stable oscillation, without being affected by any leakage current between the signal path of the oscillation circuit 40 and the power-supply voltage $V_{SS}$ line, even if such a leakage current occurs. This is described in detail below.

The descriptions of the above embodiments related to examples in which the constant voltage generation circuits 32-1 and 32-2 are formed separately and the constant bypass voltage $V_{reg1}$ connected to the electrostatic protection circuits 200-1 and 200-2 is formed separately from the constant voltage $V_{reg2}$ supplied to the oscillation circuit 40. To simplify the description herein, an idealized situation is used in which the two constant voltage generation circuits 32 are formed to be the same circuit and the same constant voltage $V_{reg}$ is provided to the electrostatic protection circuits 200-1 and 200-2 and the oscillation circuit 40.

In the circuit of this embodiment, the constant bypass voltage $V_{reg1}$ connected to the electrostatic protection circuits 200-1 and 200-2 is preferably set to a value such that the oscillation of the oscillation circuit 40 does not stop, even if a leakage current caused by a change in the environment, such as a humidity change, occurs between input-output terminals 71-1 and 71-2 of the oscillation circuit 40 and a line 73 for the power-supply voltage $V_{SS}$.

In other words, a leakage current corresponding to an environmental change such as a change in humidity could occur between the input-output terminals 71-1 and 71-2 of the oscillation circuit 40, which are attached to the electrostatic protection circuits 200-1 and 200-2, and the line 73 of the power-supply voltage $V_{SS}$.

This leakage current can occur when the IC is mounted on a circuit board, as shown in FIG. 11, and the insulation resistance of the circuit board has dropped because of an environmental change, such as a change in humidity. More specifically, a drop in the insulation resistance can occur between a wiring pattern 310 of the circuit board shown in FIG. 11, which is connected to input-output terminals of the oscillation circuit, and a wiring pattern (power-supply voltage line) for the power-supply voltage $V_{SS}$. This phenomenon is remarkably common when the material of the circuit board is a polyimide.

An equivalent circuit of FIG. 12 shows the state when a leakage current has occurred between the input-output terminals 71-1 and 71-2 of the oscillation circuit 40 and the line 73 of the power-supply voltage $V_{SS}$.

When a leakage current occurs, a forward-direction voltage $V_F$ given by the equation below is applied to a semiconductor rectifier element D2 (72) that forms one of the electrostatic protection circuits 200-1 and 200-2 (the voltage drop due to the resistance of the electrostatic protection circuits 200-1 and 200-2 is small so can be ignored).

$$V_F = |V_{SS}| - V_R - |V_{reg}| \tag{Equation 6}$$

In this case, assume that the forward-direction on-voltage that turns on the semiconductor rectifier elements 72 and 74 is $V_{Fon}$. This forward-direction on-voltage is usually on the order of 0.6 V. If the forward-direction voltage $V_F$ has a value greater than that of this forward-direction on-voltage, the semiconductor rectifier element D2 turns on and a forward-direction current flows.

For that reason, the forward-direction voltage $V_F$ is set to be less than the value of $V_{Fon}$.

$$V_F < V_{Fon} = 0.6(V) \tag{Equation 7}$$

(If the polarity of the power-supply voltage is that of a positive power source $V_{DD}$, using $V_{SS}$ as a reference potential, a forward-direction current flows in the semiconductor rectifier element D1.)

This flow of forward-direction current causes the following problems:

The constant voltage $V_{reg}$ moves towards the power-supply voltage $V_{SS}$ side (increase in absolute value).

Since the constant voltage $V_{reg}$ changes, the parasitic capacitances of the semiconductor rectifier elements of the electrostatic protection circuit also change and the frequency voltage deviation increases.

The change in constant voltage $V_{reg}$ towards the power-supply voltage $V_{SS}$ side (increase in absolute value) leads to an increase in the current consumption of the oscillation circuit.

If the semiconductor rectifier element D2 goes into a completely on state, the oscillation of the oscillation circuit will halt.

To ensure that none of the above problems occur, more specifically, to ensure that the semiconductor rectifier element D2 is not turned on, the constant bypass voltage $V_{reg}$ connected to the electrostatic protection circuits 200-1 and 200-2 must be set to a value that satisfies the above Equations 6 and 7.

For a rechargeable timepiece, the power-supply voltage $V_{SS}$ is on the order of -2 V, so the constant voltage $V_{reg}$ that satisfies both Equations 6 and 7 is given by the equation below. In other words, to ensure that the above problems do not occur, the constant bypass voltage $V_{reg}$ must be set to satisfy the equation below.

More specifically, the value of the constant bypass voltage $V_{reg}$ must be set to a value that satisfies the following equation within the expected operating range (a range of 1.2 to 2 V, for example), as the voltage range of the power-supply voltage $V_{SS}$ that enables the oscillation circuit to operate:

$$|V_{reg}| > |V_{SS}| - V_R - V_{Fon} = 1.4(V) - V_R \tag{Equation 8}$$

The use of the above-described configuration ensures that, even if a leakage current occurs between a signal of the oscillation circuit 40 (such as the input-output terminals 71-1 and 71-2) and the line 73 of the power-supply voltage $V_{SS}$, the semiconductor rectifier element 72 is not turned on by any voltage change in the signal path (the input-output terminals 71-1 and 71-2) of the oscillation circuit 40 that may be caused by that leakage current. As a result, it is possible to ensure the stable operation of the oscillation circuit even in such a leakage current should occur.

Note that the above description dealt with an example in which the polarity of the power-supply voltage $V_{SS}$ is negative with respect to a reference potential, but it should be obvious that a similar effect can be obtained in the opposite case in which the polarity of the power-supply voltage is positive with respect to the reference potential. In such a case too, it is possible to prevent a situation in which the semiconductor rectifier element D1 (74) is turned on and a forward-direction current flows, by setting the reference potential to $V_{SS}$ and setting the constant bypass voltage $V_{reg}$ to a value that satisfies Equation 8, thus enabling stable driving of the oscillation circuit. (In that case, $V_{SS}$ of FIG. 8 becomes $V_{DD}$.)

As described previously, if the constant voltage $V_{reg2}$ of the oscillation circuit 40 and the constant bypass voltage $V_{reg1}$ of the electrostatic protection circuits 200-1 and 200-2 are made to be the same constant voltage by using the constant voltage generation circuit 32 in common, a problem arises in that it is not possible to set the constant voltage for driving the oscillation circuit 40 to a small value, with the aim of reducing current consumption.

In other words, if the constant bypass voltage $V_{reg1}$ of the electrostatic protection circuits 200-1 and 200-2 is the same as the constant voltage $V_{reg2}$ used for driving the oscillation circuit 40, it is no longer possible to set the constant voltage $V_{reg2}$ to be small with the aim of reducing the current consumption of the oscillation circuit 40, so long as $V_R$ of Equation 8 does not become large, in other words, so long as a circuit board with a large insulation resistance is not In order to solve that problem, the constant bypass voltage $V_{reg1}$ is preferably set to be a constant voltage that is separate from the expected constant voltage $V_{reg1}$ for driving the oscillation circuit 40. More specifically, it is preferable to use separate constant voltage generation circuits 32-1 and 32-2 as shown in FIGS. 2 to 4, and separately generate the constant bypass voltage $V_{reg1}$ and the constant voltage $V_{reg2}$ for driving the oscillation circuit. It is also preferable that the constant bypass voltage $V_{reg1}$ supplied to the constant voltage generation circuit 32 is set to satisfy Equation 8 and also that the constant voltage $V_{reg2}$ supplied for driving the oscillation circuit 40 is set to a small absolute value that optimizes the low power consumption of the oscillation circuit 40. This makes it possible to ensure both of the conditions of reduced current and power consumptions of the oscillation circuit 40 and a stable oscillation frequency of the oscillation circuit 40.

In other words, the output $V_{reg1}$ of the constant voltage generation circuit 32-1 is set to satisfy Equation 8 and is connected to the electrostatic protection circuits 200-1 and 200-2. The output $V_{reg2}$ of the constant voltage generation circuit 32-2 is set to a small absolute value so as to optimize the reduction in current consumption of the oscillation circuit 40. This configuration makes it possible to both reduce the current consumption of the oscillation circuit 40 and also ensure that the oscillation frequency of the oscillation circuit 40 is stable.

If there is a plurality of constant voltage generation circuits, it is possible to ensure that any transient change in the constant voltage due to discharge currents during electrostatic application do not affect the oscillation circuit, by setting the constant voltage of the electrostatic protection circuit to be separate from the constant voltage of the oscillation circuit.

It should be noted, however, that the constant bypass voltage $V_{reg1}$ of the electrostatic protection circuits 200-1 and 200-2 and the constant voltage $V_{reg2}$ for driving the oscillation circuit 40 must satisfy the condition of Equation 9 given below (if Equation 9 is not satisfied, a forward-direction current will flow in the semiconductor rectifier element D2 every time the oscillation output reaches the level of $V_{reg2}$ during normal operation).

$$|V_{reg1}| > |V_{reg2}| \quad \text{(Equation 9)}$$

In other words, if the constant bypass voltage $V_{reg1}$ is generated as a constant voltage that is supplied separately from the constant voltage $V_{reg2}$ that is supplied as the power-supply voltage for the oscillation circuit 40, that constant bypass voltage $V_{reg1}$ and the constant voltage $V_{reg2}$ for driving the oscillation circuit 40 are set such that the inequality of Equation 9 is satisfied. This makes it possible to solve the two technical problems of a reduction in the current consumption of the oscillation circuit and the stability of the oscillation frequency.

As described above, this embodiment of the present invention could either provide the same constant voltage $V_{reg}$ for the electrostatic protection circuits 200-1 and 200-2 and the oscillation circuit 40, or it could provide the constant bypass voltage $V_{reg1}$ and the $V_{reg2}$ for driving separately, in order to reduce the current consumption of the oscillation circuit.

5-2 Second Embodiment

It is preferable that the constant bypass voltage $V_{reg1}$ used in the circuit of the present invention is a constant voltage having a temperature characteristic that ensures a small voltage variation with respect to a temperature change. This is described in detail below.

Figure 13:
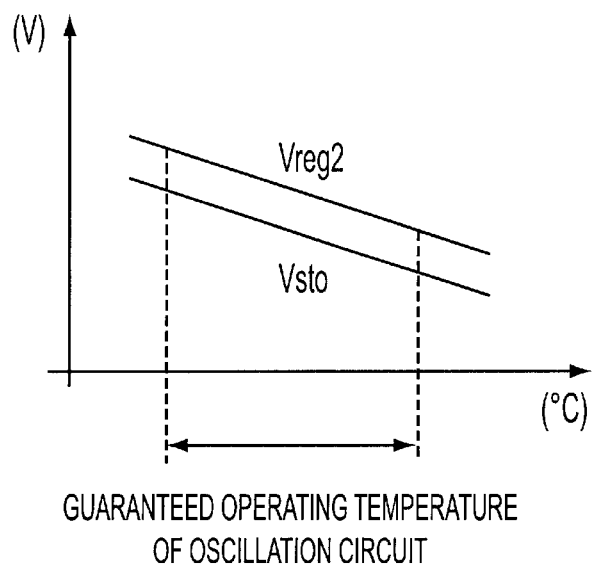
FIG. 13 is illustrative of the temperature characteristics of the oscillation-stopping voltage and the constant voltage for driving the oscillation, within the guaranteed operating temperature range of the oscillation circuit.

The voltage $V_{reg2}$ for driving the oscillation circuit 40 is set in such a manner that it has the same slope as the temperature characteristic of an oscillation-stopping voltage $V_{sto}$ of the oscillation circuit 40, as shown in FIG. 13.

This ensures that the condition of Equation 10 is satisfied, so that the oscillation of the oscillation circuit 40 does not stop within the guaranteed operating temperature range of the oscillation circuit 40, and also sets the constant voltage $V_{reg2}$ to a small value that approaches the oscillation-stopping voltage, to reduce the current consumption of the oscillation circuit 40 to the limit.

$$|V_{reg2}| > |V_{sto}| \quad \text{(Equation 10)}$$

This means that, if the oscillation-stopping voltage $V_{sto}$ of the oscillation circuit 40 has a large temperature characteristic, the temperature characteristic of the constant voltage $V_{reg2}$ for driving the oscillation circuit 40 will also be large.

If the constant voltage $V_{reg2}$ for driving the oscillation is used as the constant bypass voltage $V_{reg1}$ of the electrostatic protection circuit 200, therefore, the parasitic capacitances of the semiconductor rectifier elements of the electrostatic protection circuit 200 will also change with temperature. This leads to a problem in that the oscillation frequency of the oscillation circuit 40 will also change, and the oscillation stability of the oscillation circuit will deteriorate.

For that reason, the circuit of this embodiment of the invention generates two different constant voltages: the constant voltage $V_{reg2}$ for driving the oscillation circuit and the constant bypass voltage $V_{reg1}$ of the electrostatic protection circuit 200, as shown in FIGS. 2 to 4. In addition, a constant voltage that has a smaller temperature characteristic than the constant voltage $V_{reg2}$ for driving the oscillation circuit is used as the constant bypass voltage $V_{reg1}$. This makes it possible to suppress changes in the parasitic capacitances of the semiconductor rectifier elements of the electrostatic protection circuit 200 within the guaranteed operating temperature range of the oscillation circuit 40, by using a constant voltage having a small temperature characteristic as the constant bypass voltage $V_{reg1}$, thus making it possible to increase the stability of the oscillation frequency of the oscillation circuit 40.

Note that the constant voltage $V_{reg1}$ for driving the temperature sensor 400 is preferably used as the above-described constant bypass voltage $V_{reg1}$ with a shallow temperature characteristic, as shown by way of example in FIG. 2. The slope of the temperature characteristic of the constant voltage $V_{reg1}$ for driving the temperature sensor 400 is set to be 1 mv/° C. or less, to enable accurate measurement of temperature that is not affected by changes in the ambient temperature. For that reason, the voltage remains substantially unchanged, regardless of any changes in the ambient temperature.

Figure 14:
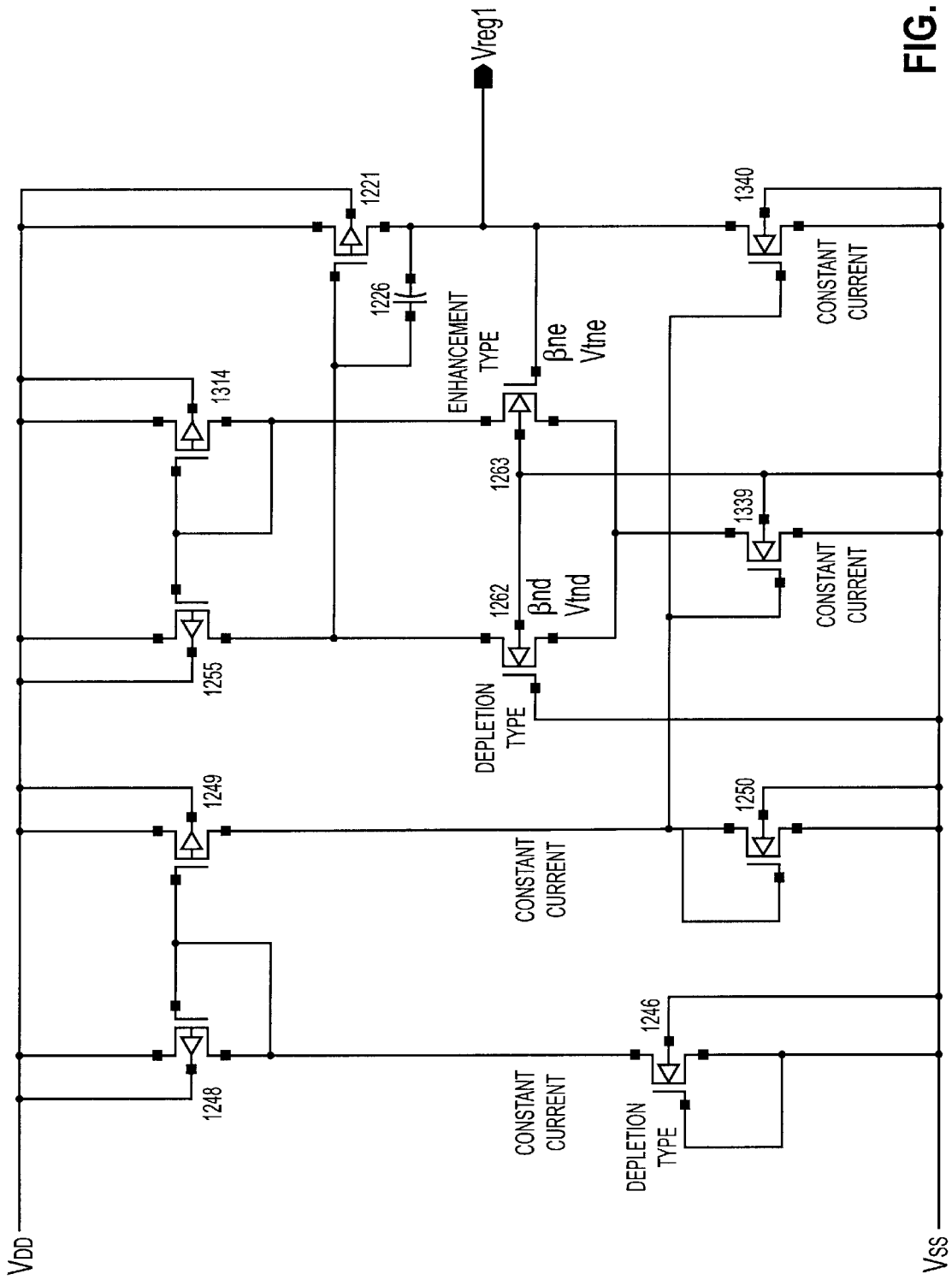
FIG. 14 is a schematic illustrative view of the constant voltage generation circuit for driving a temperature sensor.

An example of a constant voltage generation circuit that generates the constant voltage $V_{reg1}$ for driving a temperature sensor, which has a temperature characteristic with a shallow slope, is shown in FIG. 14.

In this constant voltage generation circuit 32-1, $N_{ch}$-transistors I262 and I263 are constructed to the same dimensions, and the current amplification ratio of the transistors I262 and I263 is given by:

$$\beta_{nd} = \beta_{ne}$$

In addition, if I262 is a depletion type of transistor and I263 is an enhancement type of transistor, the threshold voltages thereof should be such that:

$$V_{tnd} \ne V_{tne}$$

In that case, the output $V_{reg1}$ of the constant voltage generation circuit 32-1 is given by the equation below, to generate a constant voltage $V_{reg1}$ that has a difference in threshold voltage between I262 and I263.

$$\frac{1}{2}\beta_{nd} \cdot (-V_{tnd})^2 = \frac{1}{2}\beta_{ne} \cdot (Vgs - V_{tne})^2$$

$$Vgs = V_{tne} - V_{tnd} = V_{reg1}$$

Since the threshold voltages of the transistors I262 and I263 have the same temperature characteristics, the threshold voltage difference thereof does not change and thus a constant voltage $V_{reg1}$ that is not dependent on temperature is generated.

It should be noted, however, that the constant voltage $V_{reg1}$ of the electrostatic protection circuit and the constant voltage $V_{reg2}$ of the oscillation circuit must be such as to satisfy the inequalities of Equations 8 and 9.

5-3 Third Embodiment

Figure 15:
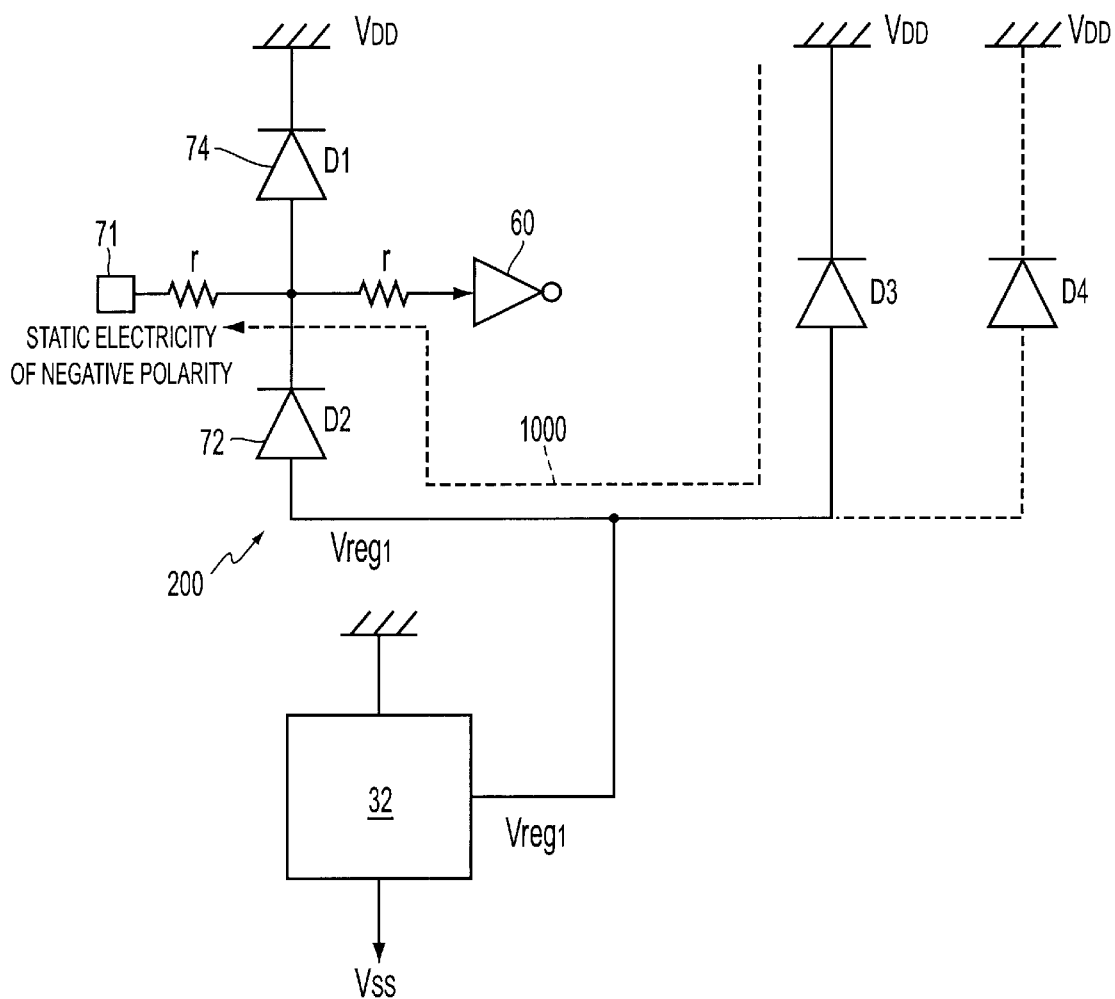
FIG. 15 is illustrative of the discharge pathways when an electrostatic voltage of a negative polarity is applied.

If it is assumed that an electrostatic voltage of a negative polarity is applied to the circuit of this embodiment, as shown in FIG. 15 by way of example, a discharge pathway 1000 is formed to discharge this negative-polarity charge to a side of the constant bypass voltage $V_{reg1}$ through the electrostatic protection circuit (first semiconductor rectifier element) 200.

If the circuit of this embodiment has a plurality of constant voltage generation circuits 32, therefore, it is preferable to use the constant voltage of the constant voltage generation circuit 32 that has the largest constant voltage drive region (over the entire circuitry to be driven at the constant voltage) as the constant bypass voltage $V_{reg1}$ for the electrostatic protection circuit. This is discussed in detail below.

In FIG. 15, D3 denotes an equivalent circuit of the entire circuitry to be driven at a constant voltage by the constant voltage generation circuit 32 (except for the electrostatic protection circuit 200). Since the circuitry to be driven at the constant voltage is basically formed of semiconductors, it can be represented schematically as a parasitic diode D3, as shown in this figure.

The capacitance of this schematic parasitic diode D3 increases as the number of circuits driven by the constant voltage increases, as mentioned previously.

In this case, this increase in the number of circuits driven by the constant voltage and the resultant increase in the capacitance of the parasitic diode D3 leads to an increase in the constant voltage drive region. The semiconductor rectifier element D3 represents a parasitic diode created within the constant voltage drive region.

If an electrostatic voltage of a negative polarity has been applied, the avalanche phenomenon in the parasitic diode D3 is utilized to create the discharge pathway 1000.

In this case, if the dimensions of the circuitry to be driven at the constant voltage increases, more specifically, if the constant voltage drive region increases, the surface area of the parasitic diode D3 of FIG. 15 that is represented as an equivalent circuit also increases, the discharge capability thereof rises, and, as a result, the electrostatic-resistance characteristic of the parasitic diode D3 becomes favorable.

For the above reason, if there are constant voltages supplied from a plurality of constant voltage generation circuits 32, it is preferable to use the constant voltage with the largest constant voltage drive region (largest circuit dimensions to be driven at the constant voltage) as the constant bypass voltage $V_{reg1}$.

It is also possible to utilize a configuration in which a semiconductor rectifier element D4 is deliberately connected parallel to the constant voltage generation circuit 32, but separate from the parasitic diode D3, so that it becomes part of the discharge circuit 1000.

In this case too, the constant bypass voltage $V_{reg1}$ of the electrostatic protection circuit 200 and the constant voltage $V_{reg2}$ for driving the oscillation circuit 40 must be such as to satisfy the conditions of Equation 8 and 9.

5-4 Fourth Embodiment

The embodiments herein have been described with respect to examples in which the positive power source $V_{DD}$ acts as a reference potential and the power-supply voltage $V_{SS}$ and a constant voltage $V_{reg}$ have negative polarity, but the present invention can equally well be applied only to a configuration in which the negative power source $V_{SS}$ acts as the reference potential and the power-supply voltage $V_{DD}$ and a constant voltage $V_{reg}$ have positive polarity.

(6) Miscellaneous

Figure 10:
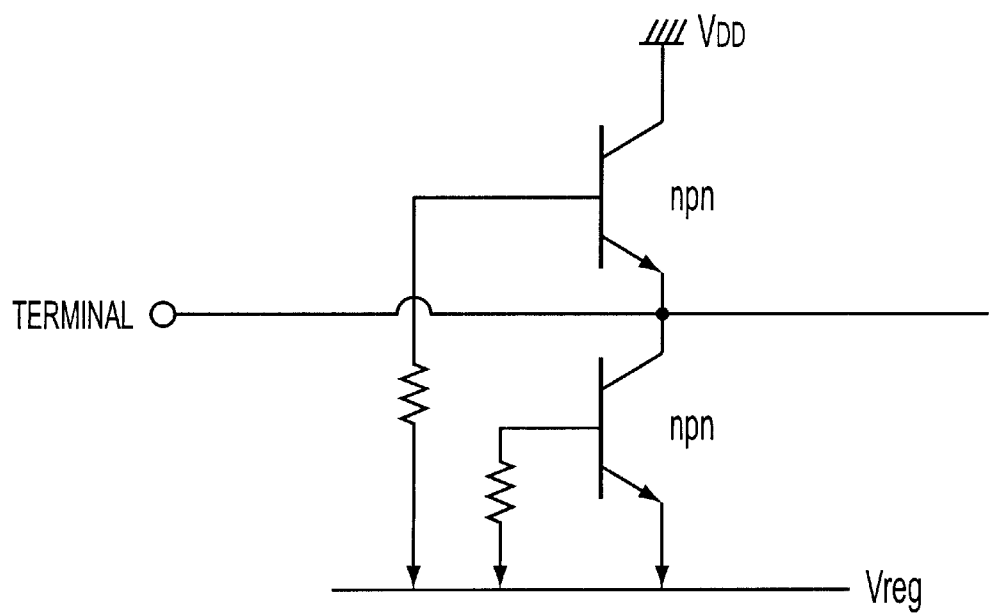
FIG. 10 is illustrative of an electrostatic protection circuit fabricated by using other types of semiconductor elements.

Note that although the embodiments described herein deal with examples in which diodes are used as semiconductor rectifier elements, it is also possible to form protective circuits with other types of semiconductor rectifier element if necessary. For example, electrostatic protection circuits could be formed by using bipolar transistors as semiconductor rectifier elements, as shown in FIG. 10.

Furthermore, although the above embodiments were described as relating to an example in which the present invention is applied to a portable wristwatch, the oscillation circuit and electrostatic protection circuit in accordance with the present invention could also be applied to other applications, such as use as a reference signal source in various types of electronic equipment in mobile phones and portable computer terminal, where the driving of a drive section (circuitry) of that electronic equipment is based on an output signal of that reference signal source.

What is claimed is:

1. An oscillation circuit comprising:

a first electrostatic protection circuit connected between a signal path of the oscillation circuit and a constant-voltage side, and bypassing an electrostatic voltage of a first polarity that intrudes into the signal path to a side of a constant bypass voltage through a first semiconductor rectifier element; and a second electrostatic protection circuit connected between the signal path and a reference potential side, and bypassing an electrostatic voltage of a second polarity that intrudes into the signal path to the reference potential side through a second semiconductor rectifier element, wherein the constant bypass voltage is set to a value such that the first and second semiconductor rectifier elements are not turned on by voltage change in the signal path caused by a leakage current, even when a leakage current is generated between the signal path and a power-supply voltage line.

2. The oscillation circuit as defined by claim 1, wherein when it is assumed that the power-supply voltage is $V_{SS}$, the forward-direction on-voltage of the semiconductor rectifier element is $V_{Fon}$, and the potential difference between the signal path and the power-supply voltage line when a leakage current is generated is $V_R$; the constant bypass voltage $V_{reg}$ is set in such a manner that the following inequality is satisfied, within a range of expected operating voltages of the power-supply voltage $|V_{SS}|$:

$$|V_{reg}| > |V_{SS}| - V_R - V_{Fon}.$$

3. The oscillation circuit as defined by claim 2, wherein the constant bypass voltage is a constant voltage $V_{reg1}$ that is supplied separately from a constant voltage $V_{reg2}$ supplied as a power-supply voltage for the oscillation circuit.

4. The oscillation circuit as defined by claim 3, wherein the constant bypass voltage $V_{reg1}$ and the constant voltage $V_{reg2}$ supplied as the power-supply voltage of the oscillation circuit are set in such a manner that the following inequality is satisfied:

$$|V_{reg1}| > |V_{reg2}|.$$

5. The oscillation circuit as defined by claim 3, wherein one voltage $V_{reg2}$, which is one of a supplied constant voltage from a constant voltage supply circuit and a constant voltage obtained by dividing or stepping up the supplied constant voltage, is used as a power-supply voltage for the oscillation circuit, and the other voltage $V_{reg1}$ is used as the constant bypass voltage.

6. The oscillation circuit as defined by claim 1, wherein a constant voltage having a temperature characteristic that ensures a small voltage variation with respect to a temperature changes is used as the constant bypass voltage.

7. The oscillation circuit as defined by claim 1,
wherein a discharging semiconductor rectifier element for discharging an electrostatic voltage of a first polarity that intrudes into the signal path to a side of a constant bypass voltage through the first semiconductor rectifier element, is provided between an output of the constant voltage supply circuit which supplies the constant bypass voltage and the reference potential.

8. An electronic circuit comprising the oscillation circuit defined by claim 1 and a drive circuit which drives a driven section, based on an output of the oscillation circuit.

9. A semiconductor device comprising the oscillation circuit defined by claim 1 and a circuit board on which the oscillation circuit is mounted.

10. An electronic timepiece comprising the oscillation circuit defined by claim 1 and a time display section which displays a time based on the oscillation circuit.

11. Electronic equipment comprising the oscillation circuit defined by claim 1 and a drive circuit which drives a driven section, based on an output of the oscillation circuit.

* * * * *